United States Patent
Fu et al.

(10) Patent No.: US 10,573,230 B2
(45) Date of Patent: Feb. 25, 2020

(54) BACKLIGHT SOURCE, DISPLAY DEVICE AND DRIVING METHOD THEREOF

(71) Applicant: BOE Technology Group Co., Ltd., Beijing (CN)

(72) Inventors: Jie Fu, Beijing (CN); Xiaochuan Chen, Beijing (CN); Shengji Yang, Beijing (CN); Dongni Liu, Beijing (CN); Lei Wang, Beijing (CN); Han Yue, Beijing (CN); Pengcheng Lu, Beijing (CN); Li Xiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 84 days.

(21) Appl. No.: 15/793,152

(22) Filed: Oct. 25, 2017

(65) Prior Publication Data
US 2018/0114481 A1    Apr. 26, 2018

(30) Foreign Application Priority Data
Oct. 26, 2016   (CN) .............................. 201610947129

(51) Int. Cl.
  *G09G 3/32*      (2016.01)
  *G09G 3/3216*    (2016.01)
  (Continued)

(52) U.S. Cl.
  CPC ....... *G09G 3/3216* (2013.01); *H01L 27/3246* (2013.01); *H01L 27/3288* (2013.01); *H01L 51/5215* (2013.01); *H01L 51/5234* (2013.01)

(58) Field of Classification Search
  CPC combination set(s) only.
  See application file for complete search history.

(56) References Cited

U.S. PATENT DOCUMENTS 8,415,880 B2 * 4/2013 Choi .................. C03C 8/24
                                           313/512
8,950,216 B2 * 2/2015 Tanaka ............... H01L 51/5246
                                           156/99

(Continued)

FOREIGN PATENT DOCUMENTS

CN    101009313 A    8/2007
CN    101662000 A    3/2010

(Continued)

OTHER PUBLICATIONS

Office Action for Chinese application No. 201610947129.2 dated Jan. 3, 2019.

*Primary Examiner* — Van N Chow
(74) *Attorney, Agent, or Firm* — Fay Sharpe LLP

(57) ABSTRACT

The present disclosure relates to a backlight source, a display device, and a driving method thereof, in the field of field of displays. The backlight source includes a Passive Matrix Organic Light Emitting Diode (PMOLED) display device, wherein the PMOLED display device includes a transparent substrate. A transparent wiring layer, an anode layer, a light emitting layer, a transparent cathode layer, and a transparent pixel definition layer are arranged on the transparent substrate subsequently. The light emitting layer includes a plurality of light emitting units for emitting white light, and the plurality of light emitting units are arranged in an array. The anode layer includes a plurality of anodes, the plurality of anodes are arranged below the corresponding plurality of light emitting units respectively, and can reflect light emitted from the corresponding light emitting units. The backlight source in the present application is implemented with PMOLED display device. The substrate, wiring layer, cathode layer and pixel definition layer of the PMOLED display device can use transparent materials, resulting in high transmittance of the backlight sources in (Continued)

the areas excluding the anodes, such that the transparent display device can have high transmittance.

18 Claims, 3 Drawing Sheets

(51) Int. Cl.
    *H01L 27/32*     (2006.01)
    *H01L 51/52*     (2006.01)

(56) References Cited

U.S. PATENT DOCUMENTS

| | | | |
|---|---|---|---|
| 8,963,143 B2 * | 2/2015 | Loebl | H01L 51/5076 |
| | | | 257/40 |
| 9,748,316 B2 * | 8/2017 | Uchida | H01L 51/5068 |
| 2007/0170860 A1 | 7/2007 | Choi et al. | |
| 2010/0052525 A1 | 3/2010 | Oda et al. | |
| 2016/0026786 A1 | 9/2016 | Shi et al. | |
| 2016/0343787 A1 | 11/2016 | Wu | |

FOREIGN PATENT DOCUMENTS

| | | |
|---|---|---|
| CN | 203674211 U | 6/2014 |
| CN | 103996697 A | 8/2014 |
| CN | 104201190 A | 12/2014 |
| CN | 104536179 A | 4/2015 |
| WO | WO2014004469 A2 | 1/2014 |

\* cited by examiner

BACKLIGHT SOURCE, DISPLAY DEVICE AND DRIVING METHOD THEREOF

This application claims priority to Chinese Patent Application No. 201610947129.2, filed with the State Intellectual Property Office on Oct. 26, 2016 and titled "BACKLIGHT SOURCE, DISPLAY DEVICE AND DRIVING METHOD THEREOF", the entire contents of which are incorporated herein by reference.

TECHNICAL FIELD

The present disclosure relates to the field of display devices, and more particularly to a backlight source, a display device, and a driving method thereof.

BACKGROUND

Transparent display devices generally refer to display devices that can form transparent display states, such that viewers can see through the display devices, and are commonly used in the fields of window display, refrigerator doors, and vehicle display, etc. The transparent display devices usually adopt liquid crystal display (LCD) devices, mainly including display panels and backlight sources. The backlight sources are generally realized by setting side light sources on both sides of the display panels and setting a corresponding light guide plate, to realize illumination of the transparent display devices.

The light sources in the above backlight sources adopt light emitting diode (LED) lights and have high power consumption. Due to the presence of the light guide plates, the transmittance of the backlight sources is low. Thus, the requirements of high transmittance and low power consumption on transparent display devices cannot be satisfied.

SUMMARY

The present disclosure provides a backlight source, a display device, and a driving method thereof for solving the problems that the backlight sources have high power consumption and low transmittance in the transparent display devices. The technical solutions are as follows:

In a first aspect, embodiments of the present disclosure provides a backlight source applied to a transparent display device, comprising: a Passive Matrix Organic Light Emitting Diode (PMOLED) display device, wherein the PMOLED display device includes a transparent substrate, a transparent wiring layer, an anode layer, a light emitting layer and a transparent cathode layer arranged sequentially on the transparent substrate, and a transparent pixel definition layer, the light emitting layer includes a plurality of light emitting units for emitting white light, and the plurality of light emitting units are arranged in an array, and the anode layer includes a plurality of anodes, the plurality of anodes are arranged below the corresponding plurality of light emitting units respectively, and are configured to reflect light emitted from the light emitting units.

In one embodiment of the present disclosure, the transparent wiring layer includes a plurality of wires, each of the plurality of wires is arranged below a corresponding row of anodes, and the transparent cathode layer includes a plurality of strip-shaped cathodes, each of the plurality of cathodes is arranged above a corresponding column of light emitting units.

In another embodiment of the present disclosure, the cathodes are indium zinc oxide (IZO) thin film electrodes or indium tin oxide (ITO) thin film electrodes.

In another embodiment of the present disclosure, the anodes include a metal reflective electrode arranged on the transparent wiring layer and a transparent electrode arranged between the metal reflective electrode and the light emitting layer.

In another embodiment of the present disclosure, the transparent electrode is an ITO thin film electrode or an IZO thin film electrode.

In another embodiment of the present disclosure, the metal reflective electrode is a silver electrode.

In another embodiment of the present disclosure, the anodes are rectangular.

In another embodiment of the present disclosure, the metal reflective electrode is an Ag electrode.

In another embodiment of the present disclosure, the wires are ITO wires or IZO wires.

In another embodiment of the present disclosure, the PMOLED display device further includes a light-shielding layer arranged between the transparent wiring layer and the transparent substrate, the light-shielding layer includes a plurality of light-shielding units, the plurality of light-shielding units are arranged below the corresponding plurality of light emitting units respectively.

In another embodiment of the present disclosure, the PMOLED display device further includes a drive circuit used to determine brightness of each pixel unit in a display panel corresponding to the backlight source; and to control operating state of each light emitting unit corresponding to each pixel unit in the PMOLED display device, in accordance with the brightness of each pixel unit in the display panel.

In another embodiment of the present disclosure, the PMOLED display device further includes an encapsulation structure arranged on the transparent cathode layer.

In a second aspect, the embodiments of the present disclosure also provide a display device, comprising a display panel and a backlight source, wherein the backlight source is the backlight source described in any embodiment of the first aspect.

In an embodiment of the present disclosure, the display panel includes a plurality of pixel units;

each of the light emitting units in the backlight source corresponds to the at least one pixel unit in the display panel in a direction perpendicular to the display panel.

In another embodiment of the present disclosure, the PMOLED display device is arranged on a light emergent side of the display panel, and the distance between the transparent cathode layer and the display panel is less than the distance between the anode layer and the display panel.

In a third aspect, the embodiments of the present disclosure further provide a method of diving a display device described in any embodiment of the second aspect, comprising:

determining brightness of each light emitting unit in a display panel; and controlling operating state of each light emitting unit corresponding to each pixel unit in a PMOLED display device, in accordance with brightness of each pixel unit in the display panel.

In an embodiment of the present disclosure, controlling the operating state of each light emitting unit corresponding to each pixel unit in the PMOLED display device in accordance with the brightness of each pixel unit in the display panel comprises:

controlling a light emitting unit corresponding to a first pixel unit in the PMOLED display device to emit light, when the brightness of the first each pixel unit is greater than or equal to a preset value, wherein the first pixel unit is any pixel unit in the display panel; and controlling the light emitting unit corresponding to the first pixel unit in the PMOLED display device not to emit light, when the brightness of the first pixel unit is less than the preset value.

The technical solution provided by the embodiments of the present disclosure may include the following advantageous benefits:

In the present disclosure, the PMOLED display device can be used as the backlight source. Since the PMOLED display device has lower power consumption than that of the LED lights of conventional backlight sources, the power consumption of the backlight sources of the transparent display devices can be reduced. Additionally, since the substrate, wiring layer, cathode layer and pixel definition layer of the PMOLED display device use transparent materials, the anodes of the PMOLED display device are not transparent, and the areas around the anodes are transparent, ensuring the transmittance of areas around the anodes and high transmittance of the backlight source in areas excluding the anodes. Meanwhile, when the PMOLED display device is be used as the backlight source, the PMOLED can attach to the top surface or the bottom surface of the plane and no light guide plate is needed, resulting in higher transmittance of the backlight source than that of the backlight sources with light guide plates in the related art to provide display devices with high transmittance.

BRIEF DESCRIPTION OF THE DRAWINGS

To describe the technical solutions in the embodiments of the present disclosure more clearly, the following briefly introduces the accompanying drawings required for describing the embodiments. The accompanying drawings in the following description show merely some embodiments of the present disclosure, and a person of ordinary skill in the art may readily derive other drawings from these accompanying drawings.

DETAILED DESCRIPTION OF THE EMBODIMENTS

The embodiments of the present disclosure will be described in further detail with reference to the enclosed drawings, to clearly present the objects, technique solutions, and advantages of the present disclosure.

The embodiments of the present disclosure provide a backlight source applied to a transparent display device. The backlight source comprises Passive Matrix Organic Light Emitting Diode (PMOLED) display device, including cathodes, light emitting units and anodes. The anodes and the cathodes can be strip-shaped and are arranged perpendicularly to each other. Light emitting units are arranged at intersection points of the anodes and the cathodes. Pixels are formed in a stacked area of the cathodes, the light emitting units and the anodes, which is the light emitting area. The light emitting units in the corresponding pixels can be driven to emit light by loading current to the selected cathodes and anodes. That is to say, during operation, the PMOLED selects the cathodes and anodes corresponding to the pixels which are to be scanned and load current to the cathodes and anodes to make the light emitting units in the pixels emit light during scanning.

Figure 1:
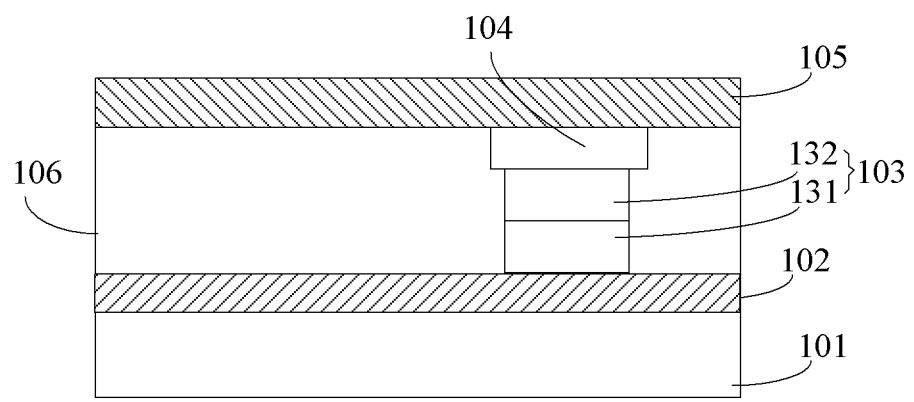
FIG. 1 is a schematic diagram of a section structure of a backlight source of the embodiments of the present disclosure.

Structure of the PMOLED display device will be described in further details hereinafter with reference to the drawings:

Referring to FIG. 1, the PMOLED display device includes a transparent substrate 101, a transparent wiring layer, an anode layer, a light emitting layer and a transparent cathode layer arranged sequentially on the transparent substrate 101, and a transparent pixel definition layer 106. Wherein, the light emitting layer includes a plurality of light emitting units 104 for emitting white light, the anode layer includes a plurality of anodes 103 for reflecting light, the plurality of anodes 103 are arranged below the corresponding plurality of light emitting units 104 respectively, the transparent wiring layer includes a plurality of wires 102 and the transparent cathode layer includes a plurality of strip-shaped cathodes 105. That is to say, the anode layer includes a plurality of anodes 103, and the plurality of anodes 103 are arranged below the corresponding plurality of light emitting units 104 respectively. The anodes 103 are configured to reflect the light emitted from the corresponding light emitting units. So, the anodes 103 are used to reflect the light emitted from the corresponding light emitting units 104, in addition to serving as electrodes.

FIG. 1 only takes an anode 103 and a light emitting unit as an example to illustrate their hierarchical relationship. In practice, a PMOLED display device includes a plurality of anodes 103 and a plurality of light emitting units 104, and the number of the anodes 103 and the light emitting units 104 will not intended limit the PMOLED display device provided by the embodiments of the present disclosure.

Figure 2:
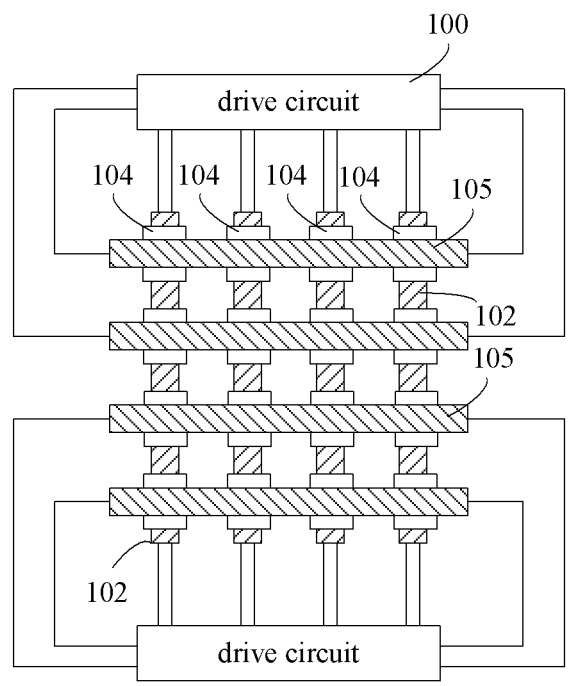
FIG. 2 is a schematic diagram of a plane structure of a backlight source shown in FIG. 1.

FIG. 2 is a schematic diagram of a plane structure of a backlight source shown in FIG. 1. As shown in FIG. 2, a plurality of light emitting units 104 are arranged in an array and each of a plurality of wires 102 is arranged below a corresponding row (up and down direction in FIG. 2) of anodes 103 (Since the anodes 103 and the light emitting units 104 are arranged in a one-to-one correspondence, the anodes will be shielded by the light emitting units when viewing from the direction shown in FIG. 2, so each wire 102 is arranged below a corresponding row of the light emitting units 104 as shown in FIG. 2). Each of the plurality of cathodes 105 is arranged above a corresponding column (left and right direction in FIG. 2) of light emitting units 104. The transparent pixel definition layer 106 is arranged among the plurality of light emitting units 104 and among the plurality of anodes 103 at the same time. The transparent pixel definition layer 106 is used to separate the plurality of light emitting units 104 and to separate the plurality of anodes 103.

Wherein, the plurality of anodes 103 being arranged below the plurality of light emitting units 104 means that each anode 103 is arranged below each light emitting unit 104. That is to say, the number of the anodes 103 is the same to that of the light emitting units 104.

Below the light emitting units 104 can refer to the direction of the side of the light emitting units 104 facing the transparent substrate 101, and above the light emitting units 104 can refer to the direction of the side of the light emitting units 104 facing away the transparent substrate 101. Accordingly, the below (or above) the anodes (or cathodes) can also refer to the direction of the side of the anodes (or cathodes) facing (or facing away) the transparent substrate 101. What should be noted is that both above and below refer to being in the direction perpendicular to the substrate.

Wherein, row and column are relative terms. The plurality of anodes 103 corresponding to the wires 102 in FIG. 2 can also be referred to as a column of anodes 103. And the plurality of light emitting units 104 corresponding to each cathode 105 can also be referred to as a row of light emitting units 104.

As described above, the plurality of light emitting units 104 can be distributed in an array. Thus, the anodes 103 can be distributed in an array, that is to say, both the light emitting units 104 and the anodes 103 can be arranged in arrays.

In the embodiments of the present disclosure, a row of anodes 103 are connected with a wire. Correspondingly, the cathodes 105 are distributed to be strip-shaped cathodes. In other embodiments, each anode 103 can be connected to one wire so that they can be controlled individually. In this situation, the cathodes can be planar cathodes.

In the present disclosure, the PMOLED display devices can be used as the backlight sources. Since the PMOLED display devices have lower power consumption than that of the LED lights of conventional backlight sources, the power consumption of the backlight sources of the transparent display devices can be reduced. Additionally, since the substrate, wiring layer, cathode layer and pixel definition layer of the PMOLED display device can use transparent materials, only the anodes of the PMOLED are not transparent, and the areas around the anodes are transparent, ensuring the transmittance of the areas around the anodes and high transmittance of the backlight sources in the areas excluding the anodes. Meanwhile, when the PMOLED display device is be used as the backlight source, the PMOLED can attach to the top surface or the bottom surface of the plane and no light guide plate is needed, resulting in higher transmittance of the backlight source than that of the backlight sources with light guide plates in the related art to provide display devices with high transmittance.

In the embodiments of the present disclosure, the cathodes 105 may be indium zinc oxide (IZO) thin film electrodes or indium tin oxide (ITO) thin film electrodes. By using the ITO or IZO film to produce the cathodes, the cathodes can have good conductivity and high transmittance to guarantee the high transmittance of the entire backlight source. In the embodiments of the present disclosure, the strip-shaped cathodes can be obtained through patterning the cathodes.

In the embodiments of the present disclosure, the shapes of the anodes 103 include, but are not limited to, rectangle.

As shown in FIG. 1, the anodes 103 may include metal reflective electrodes 131 on the transparent wiring layer and transparent electrodes 132 between the metal reflective electrodes 131 and light emitting layer. The anodes can include metal reflective electrodes reflecting the light emitted from the OLED and the transparent electrodes on the metal reflective electrodes, and the transparent electrodes can be deposited between the metal reflective electrodes and the light emitting units to prevent the metal reflective electrodes from being oxidized. That is to say, the anodes 103 consist of two parts, i.e. the metal reflective electrodes 131 and the transparent electrodes 132. The metal reflective electrodes 131 are deposited on the transparent wiring layer and the transparent electrodes 132 are deposited between the metal reflective electrodes 131 and the light emitting layer. Wherein, the metal reflective electrodes 131 can reflect the light emitted from the light emitting units 104 in the OLED, and the transparent electrodes 132 deposited between the metal reflective electrodes 131 and the light emitting units 104 can prevent the metal reflective electrodes 1313 from being oxidized.

Wherein, the transparent electrodes 132 may be the transparent thin film electrodes. For example, the transparent electrodes 132 may be the ITO thin film electrodes or IZO thin film electrodes. The transparent film electrodes produced with ITO or IZO film have good conductivity and high transmittance, so that the metal reflective electrodes can be guaranteed to reflect the light emitted from the light emitting units.

Wherein, the metal reflective electrodes 131 may be silver (Ag) electrodes. On one hand, the metal reflective electrodes made of Ag can guarantee reflection effect on the light emitted from the light emitting units. On the other hand, since the metal reflective electrodes are arranged between wires and the transparent electrodes, Ag can guarantee signal transmission effect from the wires to the transparent electrodes. Of course, the metal reflective layer 131 may also be made of other materials, such as silver magnesium (Mg) alloy.

Wherein, the wires 102 can be ITO wires or IZO wires. By using ITO or IZO film to produce the wires, the wires may have good conductivity and high transmittance to guarantee the high transmittance of the whole backlight sources.

As shown in FIG. 2, the PMOLED display device can further include a drive circuit 100 for determining brightness of each pixel unit of the display panel corresponding to the backlight source (PMOLED display device). Operation state of each light emitting unit 104 of the PMOLED display device corresponding to each pixel unit can be controlled in accordance with the brightness of each pixel unit in the display panel. Wherein, the operating state of light emitting units 104 can refer to the illuminating or not illuminating of the light emitting unit 104, and the illumination brightness.

In the embodiments of the present disclosure, the light emitting unit corresponding to the pixel unit in the PMOLED display device can be controlled not to emit light when the brightness of one pixel unit in the display panel is low; the light emitting unit corresponding to the pixel unit in the PMOLED display device can be controlled to emit light when the brightness of one pixel unit in the display panel is high. Pixel units with high brightness demand can be irradiated with light, to perform displaying. Pixel units with low brightness demand can be irradiated with light from the high brightness area rather than with direct light to further reduce power consumption.

The drive circuit can drive the light emitting units to emit light in accordance with the brightness of the display panel, so that a portion of the light emitting units of the PMOLED display device emit light, resulting in reduction of the power consumption of the backlight sources. The backlight sources can be the PMOLED display device, and control the light emitting units thereof to load voltage to the anodes and the cathodes instead of using thin film transistor switches, resulting in fast response speed without impacting the response speed of the entire display device due to the above adjustment.

As shown in FIG. 2, the drive circuit 100 can be connected to the cathodes 105 and the wires 102 (i.e., the anodes 103) simultaneously, and control the operation state of the light emitting units 104 by controlling the voltage input on the cathodes 105 and the wires 102.

Further, the driver circuit 100 may be implemented by one or more driver chips, such as the two driver chips are shown in FIG. 2.

Figure 3:
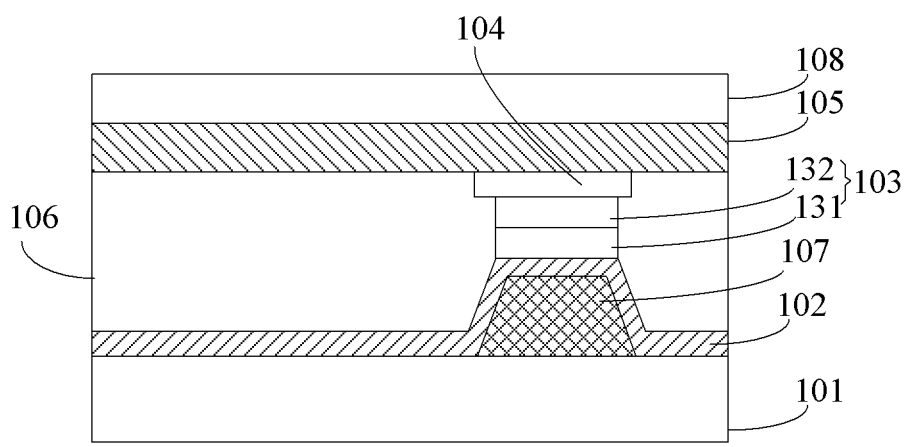
FIG. 3 is a schematic diagram of a section structure of another backlight source of the embodiments of the present disclosure.

FIG. 3 is a schematic diagram illustrating structure view of another PMOLED display device in accordance with an embodiment of the present disclosure. Referring to FIG. 3, compared with the PMOLED display device in FIG. 1, the PMOLED display device herein may further include a light shielding layer between the transparent wiring layer and the transparent substrate 101. The light shielding layer can include a plurality of light shielding units 107 arranged below the corresponding plurality of light emitting units 104 respectively. The light emitted to the backlight source can be absorbed by the light shielding layer 107, thereby being prevented from being disturbed by external light. In addition, when the PMOLED display device is arranged on the light emergent surface of the display panel to serve as the backlight source, and when the anodes of the PMOLED display device face away from the display panel, the metal reflective electrodes of the anodes can be shielded by the light shielding layer, thereby being prevented from emitting light externally (refer to following description of FIG. 4).

Wherein, the plurality of light shielding units 107 arranged below the corresponding plurality of light emitting units 104 respectively means one light shielding unit 107 is arranged below one corresponding light emitting unit 104, that is, the numbers of the light shielding units and the light emitting units 104 can be equal.

Wherein, the light shielding units 107 may be made of opaque metals or organic materials.

As shown in FIG. 3, the PMOLED display devices may also include an encapsulation structure 108 above the transparent cathode layer. Wherein, above the transparent cathode layer can be the direction of the side of the transparent cathode layer facing away from the transparent substrate 101. The encapsulation structure can be designed to protect the backlight source. Wherein, the encapsulation structure 108 can be a transparent insulating layer, such as a silicon nitride layer, a resin layer, which enhance the light transmittance while achieving insulation protection.

In the embodiment of the present disclosure, the transparent substrate 101 may be a glass substrate, a plastic substrate, a silicon substrate, or the like.

The embodiments of the present disclosure further provide a display device, including the backlight source shown in FIG. 1 or FIG. 3.

In the detailed implementation, the display apparatus of the embodiments of the present disclosure can be a mobile phone, a tablet, a TV, a display device, a laptop computer, a digital phone frame, a GPS, or any other products or parts with display functionality.

In the present disclosure, the PMOLED display device can be used as the backlight source. Since the PMOLED display device has lower power consumption than that of the LED lights of conventional backlight sources, the power consumption of the backlight sources of the transparent display devices can be reduced. Additionally, since the substrate, wiring layer, cathode layer and pixel definition layer of the PMOLED display device use transparent materials, the anodes of the PMOLED display device are not transparent, and the areas around the anodes are transparent, ensuring the transmittance of areas around the anodes and high transmittance of the backlight source in areas excluding the anodes. Meanwhile, when the PMOLED display device is used as the backlight source, the PMOLED can attach to the top surface or the bottom surface of the plane and no light guide plate is needed, resulting in higher transmittance of the backlight source than that of the backlight sources with light guide plates in the related art to provide display devices with high transmittance requirement.

Wherein, the display panel can be a transparent LCD display panel.

Wherein, the display panel can be a Twisted Nematic (TN) display panel, or an In-Plane Switching (IPS) display panel, a Vertical Alignment (VA) display panel or the like. Since the TN display panel is in a normally while mode, the crystal liquid can also transmit light when no voltage is loaded, thereby facilitating the transparent display.

In the embodiments of the present disclosure, the display panel includes a plurality of pixel units (pixel units in the display panel are arranged in an array); each of the light emitting units in the backlight source corresponds to the at least one pixel unit in the display panel in a direction perpendicular to the display panel. Each of the light emitting units in the backlight source is used to provide backlight to the corresponding at least one pixel unit.

Figure 4:
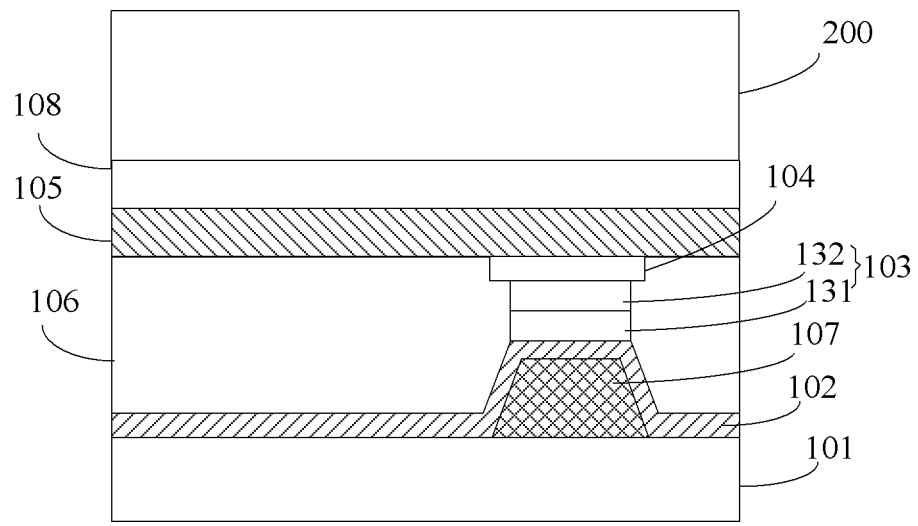
FIG. 4 is a schematic diagram of a section structure of a display device of the embodiments of the present disclosure.

As shown in FIG. 4, the PMOLED display device can be provided on the light emergent side of the display panel 200, and the distance between the transparent cathode layer and the display panel 200 can be less than the distance between the anode layer and the display panel 200. Wherein, the light emergent side of the display panel 200 can be a displaying side of the display panel 200 (such as a viewer side). In this embodiment, the backlight source can be moved forward to prevent the impact from the light reflection of the PMOLED metal reflective electrodes, when the backlight source is set backward. In this embodiment, the light emitted from the PMOLED can enter the display panel from the light emergent side of the display panel 200, and are reflected (form the backlight source of the display panel) when electrodes in the display panel (e.g., metal stripe electrodes) are irradiated. The reflected light can go through the liquid crystal and emit from the light emergent side under the control of the liquid crystal, to display on the display panel.

Figure 5:
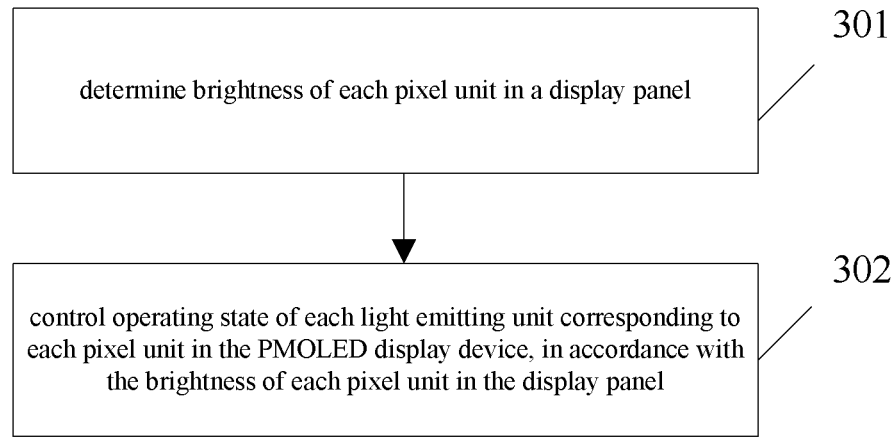
FIG. 5 is a flow chart of a driving method of a display device of the embodiments of the present disclosure.

FIG. 5 is a flow chart of a driving method of a display device in an embodiment of the present disclosure. The method can be used for driving the aforementioned display device, as shown in FIG. 5, the method comprising:

At step 301, brightness of each pixel unit in the display panel is determined.

During implementation, the brightness of each pixel unit can be determined in accordance with the data signal of the display panel, and the data signal can be obtained through the drive units of the display panel.

In the embodiment of the present disclosure, the brightness of each pixel unit in the display panel is acquired by controlling the display grayscale thereof. Since different grayscale corresponds to different grayscale voltage (data signal), the brightness of each pixel unit can be determined in accordance with the data signal of the display panel.

At step 302: the operation state of each light emitting unit corresponding to each pixel unit in the PMOLED display device can be controlled in accordance with the brightness of each pixel unit in the display panel.

In the present disclosure, by driving the light emitting units to emit light in accordance with the brightness of each pixel unit in the display panel via the drive circuit, a portion of the light emitting units in the PMOLED display device can emit light, and the power consumption of the backlight source can be reduced.

During implementation, the step 302 may comprise:

the corresponding light emitting unit in the PMOLED display device can be controlled to emit light, when the brightness of the pixel unit is greater than or equal to a preset value; the corresponding light emitting unit in the PMOLED display device can be controlled not to emit light when the brightness of the pixel unit is less than the preset value. The pixel units with high brightness demand can be irradiated with light to display, and the pixel units with low brightness demand may be irradiated with light form high brightness rather with direct light, thereby reducing the power consumption.

Further, the light emitting unit corresponding to the first pixel unit in the PMOLED display device can be controlled to emit light, when the brightness of the first each pixel unit is greater than or equal to the preset value, wherein the first pixel unit is any pixel unit in the display panel; the light emitting unit corresponding to the first pixel unit in the PMOLED display device not to emit light, when the brightness of the first pixel unit is less than the preset value.

Figure 6:
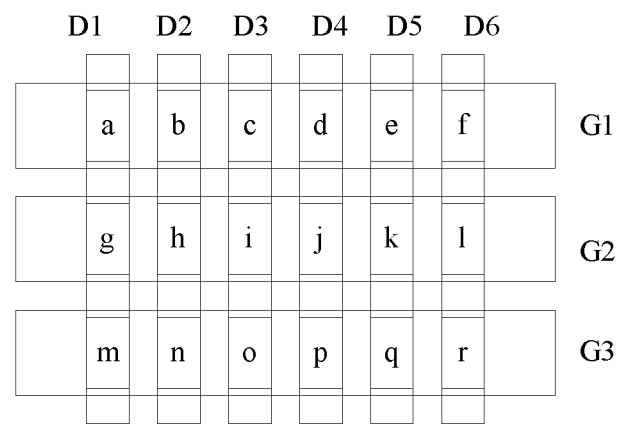
FIG. 6 is a schematic diagram of a display area of the embodiments of the present disclosure.

The driving method of the display device can be described below with the following examples:

Referring to FIG. 6, when the display panel displays only in the regions of c, d, i, and j, only regions of the four intersections of G1, G2 and D3, D4 may need to be driven to emit light, resulting in corresponding illumination in the display area for regional display. In FIG. 6, a region may include one pixel, or a plurality of pixels. Correspondingly, the region corresponding to the G1 or G2 may include a cathode, or a plurality of cathodes; the region corresponding to the G3 or G4 may include a wire, or a plurality of wires.

The foregoing are only preferred embodiments of the present disclosure, and do not intend to limit the disclosure. Within the spirit and principles of the disclosure, any modifications, equivalent substitutions, improvements, etc., are protected within the scope of the present disclosure.

What is claimed is:

1. A backlight source applied to a transparent display device, comprising: a Passive Matrix Organic Light Emitting Diode (PMOLED) display device, wherein the PMOLED display device includes a transparent substrate, a transparent wiring layer, an anode layer, a light emitting layer and a transparent cathode layer arranged sequentially on the transparent substrate, and a transparent pixel definition layer, the light emitting layer includes a plurality of light emitting units for emitting white light, and the plurality of light emitting units are arranged in an array, the anode layer includes a plurality of anodes, the plurality of anodes are arranged below the corresponding plurality of light emitting units respectively, and are configured to reflect light emitted from the corresponding light emitting units, wherein the PMOLED display device further includes a light-shielding layer arranged between the transparent wiring layer and the transparent substrate, the light-shielding layer includes a plurality of light-shielding units, the plurality of light-shielding units are arranged below the corresponding plurality of light emitting units respectively, to prevent the metal reflective electrodes from emitting light externally, and wherein the PMOLED display device is arranged on a light emergent side of a display panel.

2. The backlight source of claim 1, wherein the transparent wiring layer includes a plurality of wires, each of the plurality of wires is arranged below a corresponding row of anodes, and the transparent cathode layer includes a plurality of strip-shaped cathodes, each of the plurality of cathodes is arranged above a corresponding column of light emitting units.

3. The backlight source of claim 1, wherein the plurality of anodes include a metal reflective electrode arranged on the transparent wiring layer and a transparent electrode arranged between the metal reflective electrode and the light emitting layer.

4. The backlight source of claim 3, wherein the metal reflective electrode is a silver electrode.

5. The backlight source of claim 1, wherein the plurality of anodes are rectangular.

6. The backlight source of claim 1, wherein the PMOLED display device further includes a drive circuit used to determine brightness of each pixel unit in the display panel corresponding to the backlight source; and to control operating state of each light emitting unit corresponding to each pixel unit in the PMOLED display device, in accordance with to the brightness of each pixel unit in the display panel.

7. The backlight source of claim 1, wherein the PMOLED display device further includes an encapsulation structure arranged above the transparent cathode layer.

8. A display device, comprising a display panel and a backlight source, wherein the backlight source is applied to a transparent display device and comprises a Passive Matrix Organic Light Emitting Diode (PMOLED) display device, the PMOLED display device includes a transparent substrate, a transparent wiring layer, an anode layer, a light emitting layer and a transparent cathode layer arranged sequentially on the transparent substrate, and a transparent pixel definition layer, the light emitting layer includes a plurality of light emitting units for emitting white light, the plurality of light emitting units are arranged in an array, the anode layer includes a plurality of anodes, the plurality of anodes are arranged below the corresponding plurality of light emitting units respectively, and are configured to reflect light emitted from the corresponding light emitting units, wherein the PMOLED display device further includes a light-shielding layer arranged between the transparent wiring layer and the transparent substrate, the light-shielding layer includes a plurality of light-shielding units, the plurality of light-shielding units are arranged below the corresponding plurality of light emitting units respectively, to prevent the metal reflective electrodes from emitting light externally, and wherein the PMOLED display device is arranged on a light emergent side of the display panel.

9. The display device of claim 8, wherein the transparent wiring layer includes a plurality of wires, each of the plurality of wires is arranged below a corresponding row of anodes, and the transparent cathode layer includes a plurality of strip-shaped cathodes, each of the plurality of cathodes is arranged above a corresponding column of light emitting units.

10. The display device of claim 8, wherein the plurality of anodes include a metal reflective electrode arranged on the transparent wiring layer and a transparent electrode arranged between the metal reflective electrode and the light emitting layer.

11. The display device of claim 8, wherein the metal reflective electrode is a silver electrode.

12. The display device of claim 8, wherein the plurality of anodes are rectangular.

13. The display device of claim 8, wherein the PMOLED display device further includes a drive circuit used to determine brightness of each pixel unit in the display panel corresponding to the backlight source; and to control operating state of each light emitting unit corresponding to each pixel unit in the PMOLED display device, in accordance with the brightness of each pixel unit in the display panel.

14. The display device of claim 8, wherein the PMOLED display device further includes an encapsulation structure arranged on the transparent cathode layer.

15. The display device of claim 8, wherein the display panel includes a plurality of pixel units, and each of the light emitting units in the backlight source is arranged corresponding to the at least one pixel unit in the display panel in a direction perpendicular to the display panel.

16. The display device of claim 8, wherein the distance between the transparent cathode layer and the display panel is less than the distance between the anode layer and the display panel.

17. A method of driving a display device, wherein the display device comprises a display panel and a backlight source, the backlight source is applied to a transparent display device and comprises a Passive Matrix Organic Light Emitting Diode (PMOLED) display device, the PMOLED display device includes a transparent substrate, a transparent wiring layer, an anode layer, a light emitting layer and a transparent cathode layer arranged sequentially on the transparent substrate, and a transparent pixel definition layer, the light emitting layer includes a plurality of light emitting units for emitting white light, the plurality of light emitting units are arranged in an array, the anode layer includes a plurality of anodes, the plurality of anodes are arranged below the corresponding plurality of light emitting units respectively, and are configured to reflect light emitted from the corresponding light emitting units, the method comprising:

determining brightness of each pixel unit in a display panel; and controlling operating state of each light emitting unit corresponding to each pixel unit in the PMOLED display device, in accordance with the brightness of each pixel unit in the display panel, wherein the PMOLED display device further includes a light-shielding layer arranged between the transparent wiring layer and the transparent substrate, the light-shielding layer includes a plurality of light-shielding units, the plurality of light-shielding units are arranged below the corresponding plurality of light emitting units respectively, to prevent the metal reflective electrodes from emitting light externally, and wherein the PMOLED display device is arranged on a light emergent side of the display panel.

18. The method of claim 17, wherein controlling the operating state of each light emitting unit corresponding to each pixel unit in the PMOLED display device in accordance with the brightness of each pixel unit in the display panel comprises:

controlling a light emitting unit corresponding to a first pixel unit in the PMOLED display device to emit light, when the brightness of the first each pixel unit is greater than or equal to a preset value, wherein the first pixel unit is any pixel unit in the display panel; and controlling the light emitting unit corresponding to the first pixel unit in the PMOLED display device not to emit light, when the brightness of the first pixel unit is less than the preset value.

* * * * *